(12) United States Patent
Hipwell, Jr. et al.

(10) Patent No.: US 6,989,493 B2
(45) Date of Patent: Jan. 24, 2006

(54) ELECTRICAL FEEDTHROUGH ASSEMBLY FOR A SEALED HOUSING

(75) Inventors: Roger L. Hipwell, Jr., Eden Prairie, MN (US); Neal F. Gunderson, Lake Elmo, MN (US); Zine-Eddine Boutaghou, North Oaks, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/792,601

(22) Filed: Mar. 3, 2004

(65) Prior Publication Data

US 2005/0194174 A1 Sep. 8, 2005

(51) Int. Cl.
*H01B 17/26* (2006.01)
*H05K 1/16* (2006.01)

(52) U.S. Cl. .................. 174/151; 174/261; 174/262; 174/263

(58) Field of Classification Search ............ 174/151, 174/251, 256, 259, 261, 262, 263, 265
See application file for complete search history.

(56) References Cited

U.S. PATENT DOCUMENTS

| | | | |
|---|---|---|---|
| 4,110,506 A | 8/1978 | Cottingham | |
| 5,097,366 A | 3/1992 | Ueki | |
| 5,241,438 A | 8/1993 | Matsushima | |
| 5,276,577 A | 1/1994 | Brooks et al. | |
| 5,303,119 A * | 4/1994 | Hilbrink | 174/261 |
| 5,357,386 A | 10/1994 | Haidari | |
| 5,421,943 A | 6/1995 | Tam | |
| 5,454,157 A | 10/1995 | Ananth et al. | |
| 5,624,750 A | 4/1997 | Martinez | |
| 5,632,628 A | 5/1997 | Wagner | |
| 5,732,459 A | 3/1998 | Shiraishi | |
| 5,780,771 A | 7/1998 | Beckwith | |
| 6,031,729 A | 2/2000 | Berkely | |
| 6,135,782 A | 10/2000 | Cox | |
| 6,147,870 A * | 11/2000 | Pommer | 174/265 |
| 6,164,837 A | 12/2000 | Haake | |
| 6,168,459 B1 | 1/2001 | Cox | |
| 6,246,014 B1 * | 6/2001 | Pommer | 174/261 |
| 6,303,288 B1 | 10/2001 | Furcht | |
| 6,423,938 B1 | 7/2002 | Murari | |
| 6,436,853 B2 | 8/2002 | Lin | |
| 6,541,712 B1 * | 4/2003 | Gately et al. | 174/266 |
| 6,678,112 B1 | 1/2004 | Kaneko | |
| 6,697,217 B1 | 2/2004 | Codilian | |

(Continued)

*Primary Examiner*—Dean A. Reichard
*Assistant Examiner*—Adolfo Nino
(74) *Attorney, Agent, or Firm*—Fellers, Snider, et al.

(57) ABSTRACT

An electrical feedthrough assembly for establishing an electrical connection path through an aperture in a side wall of a housing, and a method of fabrication thereof. The feedthrough assembly comprises a plate and at least one electrical contact which extends through the plate. Preferably, a heating member is further provided to extend along a circumference of the plate. The plate is sized to span and surround the aperture so that, upon generation of heat by the heating member, at least one ring of sealing material adjacent the heating member flows to establish a seal between the plate and the housing wall surrounding the aperture. The heat is preferably generated by applying current to the heating member. The feedthrough assembly is preferably fabricated using a microfabrication process. A batch fabrication operation is preferably employed so that a population of the plates are formed from a single panel and subsequently separated therefrom.

27 Claims, 6 Drawing Sheets

U.S. PATENT DOCUMENTS

| | | | |
|---|---|---|---|
| 6,730,856 B2 * | 5/2004 | Furukuwa | 174/256 |
| 6,803,527 B2 * | 10/2004 | Dishongh et al. | 174/260 |
| 6,803,658 B2 * | 10/2004 | Suzuki | 174/255 |
| 6,828,514 B2 * | 12/2004 | Chan et al. | 174/262 |
| 6,849,805 B2 * | 2/2005 | Honda et al. | 174/250 |
| 6,856,490 B2 | 2/2005 | Rosner et al. | |
| 6,875,930 B2 * | 4/2005 | Peterson | 174/261 |
| 6,879,492 B2 * | 4/2005 | Alcoe et al. | 174/261 |
| 2002/0167792 A1 | 11/2002 | Osterhout | |
| 2003/0016468 A1 | 1/2003 | Hayakawa | |

\* cited by examiner

ELECTRICAL FEEDTHROUGH ASSEMBLY FOR A SEALED HOUSING

FIELD OF THE INVENTION

The claimed invention relates generally to the field of mechanical enclosures and more particularly, but not by way of limitation, to an electrical feedthrough assembly for a sealed housing, such as used in a data storage device.

BACKGROUND

Disc drives are digital data storage devices which store and retrieve large amounts of user data in a fast and efficient manner. The data are magnetically recorded on the surfaces of one or more data storage discs (media) affixed to a spindle motor for rotation at a constant high speed.

An array of vertically aligned data transducing heads are controllably positioned by an actuator to read data from and write data to tracks defined on the recording surfaces. An actuator motor rotates the actuator to move the heads across the disc surfaces. The heads are configured to be hydrodynamically supported adjacent the disc surfaces by fluidic pressures established by the high speed rotation of the discs.

It is generally desirable to control the interior fluidic environment within a data storage device housing. Seals are often employed to prevent the ingress of contaminants from the external environment. Moreover, some device designers have proposed hermetically sealed designs that utilize a lower density atmosphere, such as an inert gas (helium, etc.), to allow the device achieve higher levels of operational performance.

Disc drive designers are constrained by a number of factors, including continually reduced form factors and internal clearance issues, to provide effective internal fluidic control. With the continued demand for higher performance data storage devices, there remains a continual need for improved housing configurations, and it is these and other improvements that the claimed invention is generally directed.

SUMMARY OF THE INVENTION

As embodied herein and as claimed below, the present invention is generally directed to an electrical feedthrough assembly which establishes an electrical connection path through an aperture in a side wall of a housing, a housing incorporating the feedthrough assembly, and a method of fabricating the feedthrough assembly.

In accordance with preferred embodiments, the feedthrough assembly comprises a plate having opposing sides and a thickness therebetween. At least one electrical contact extends through the thickness of the plate to establish the electrical connection path. An optional heating member preferably extends along a circumference of the plate.

The plate is sized to span and surround the aperture so that, upon generation of heat by the heating member, at least one ring of sealing material adjacent the heating member flows to establish a seal between the plate and the housing wall surrounding the aperture.

The sealing material preferably comprises one or more rings of solder or thermoset adhesive. Preferably, the sealing material comprises a plurality of adjacent, closed concentric rings which establish a substantially hermetic seal.

The heating member preferably comprises an embedded electrical conductor which circumferentially extends adjacent a peripheral edge of the plate. The heating member generates the aforementioned heat by application of current to the conductor.

In accordance with further preferred embodiments, the feedthrough assembly is fabricated using a method comprising steps of providing a planar substrate and forming the at least one electrical contact through a thickness of the substrate using a microfabrication process.

Preferably, the substrate comprises silicon which is insulated from conductive traces and contacts with a material such as silicon dioxide or silicon nitride. Choice of substrates and materials allows for utilization of microfabrication processes (such as photolithography, wet and dry chemical etching, chemical vapor deposition, electroplating, sputtering, ion milling, etc.) that are employed n MEMS (Micro-ElectroMechancial Systems) and microelectronics fabrication.

Such a fabrication method is further preferably implemented into a batch fabrication method in which multiple plates are manufactured as part of a large panel and later separated for individual use. Such a batch fabrication method combines the precision and control of microfabrication with a lower-cost manufacturing method compared with conventional machining.

In further preferred embodiments, a sealed housing is provided comprising a planar housing member having an aperture in combination with the aforedescribed feedthrough assembly.

These and various other features and advantages which characterize the claimed invention will become apparent upon reading the following detailed description and upon reviewing the associated drawings.

DETAILED DESCRIPTION

Figure 1:
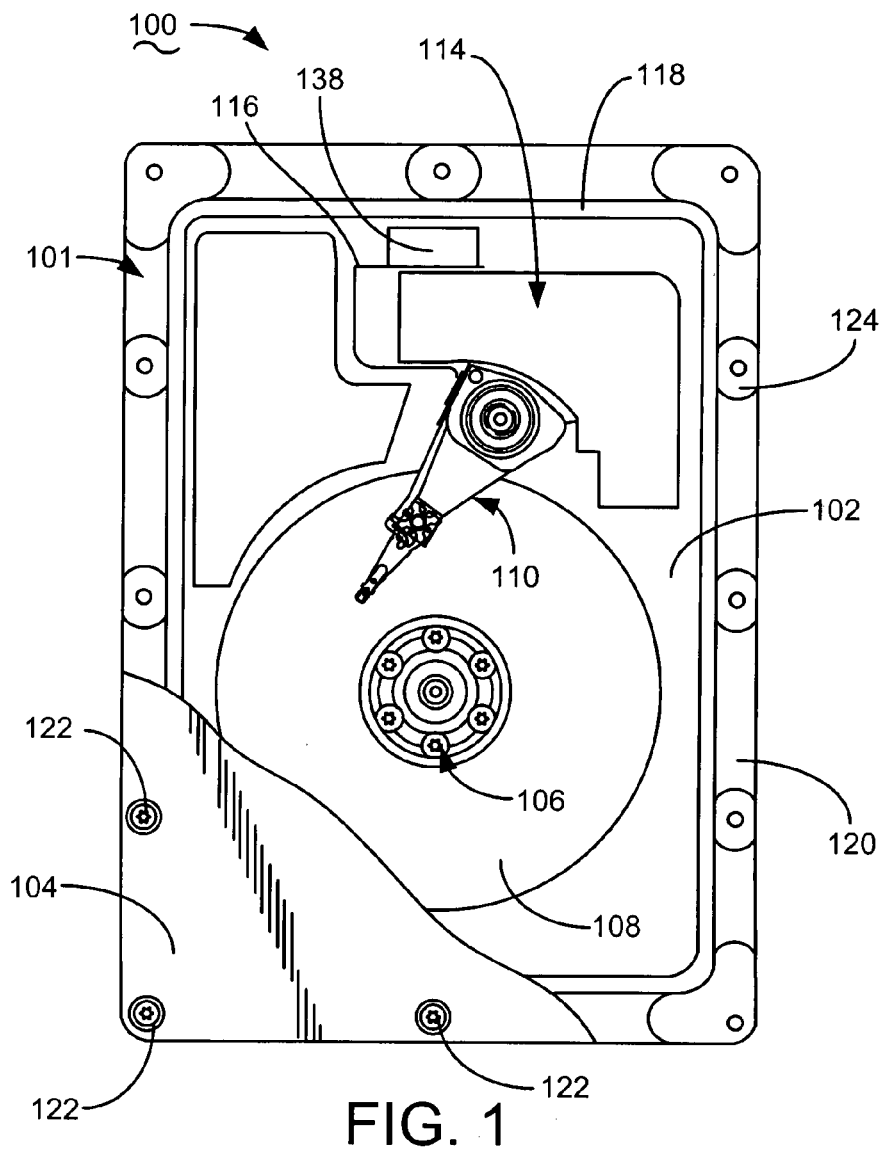
FIG. 1 is a top plan representation of a data storage device having a hermetically sealable housing and an electrical feedthrough assembly to facilitate electrical connections through a housing wall.

FIG. 1 provides a top plan view of a data storage device constructed in accordance with preferred embodiments of the present invention. The data storage device is preferably characterized as a disc drive 100 of the type which magnetically stores and retrieves digital data from and to a host computer device.

The disc drive 100 includes an enclosed housing 101 which defines an internal environment for the drive. The housing 101 is preferably characterized as a clamshell-type housing formed by a pair of substantially planar housing members including a base deck 102 and a top cover 104 (shown in partial cut-away).

The housing 101 is configured to establish a hermetic seal against the exterior environment outside the device 100. Preferably, the housing 101 is supplied with an inert fluidic atmosphere (e.g., helium) at a selected atmospheric pressure, such as standard atmospheric pressure, or a pressure above or below standard atmospheric pressure. The inert fluidic atmosphere advantageously reduces windage effects on the actuator 110 and permits the use of lower fly heights for the heads 112 due to smaller molecules in the air bearing. This improves the mechanical performance of the device 100 and allows for higher areal data storage densities on the discs 108.

The housing 101 supports a spindle motor 106 which rotates a number of data storage discs 108 at a constant high speed. A rotary actuator 110 supports an associated number of data transducing heads 112, with one head per disc recording surface. The actuator 110 is rotated by an actuator motor 114, preferably characterized as a voice coil motor, VCM.

A flex circuit assembly 116 provides electrical communication paths between the actuator 110 and a printed circuit board (PCB, not shown in FIG. 1). The PCB is mounted to an exterior surface of the base deck 102 and supports communication and control electronics for the device 100.

Figure 2:
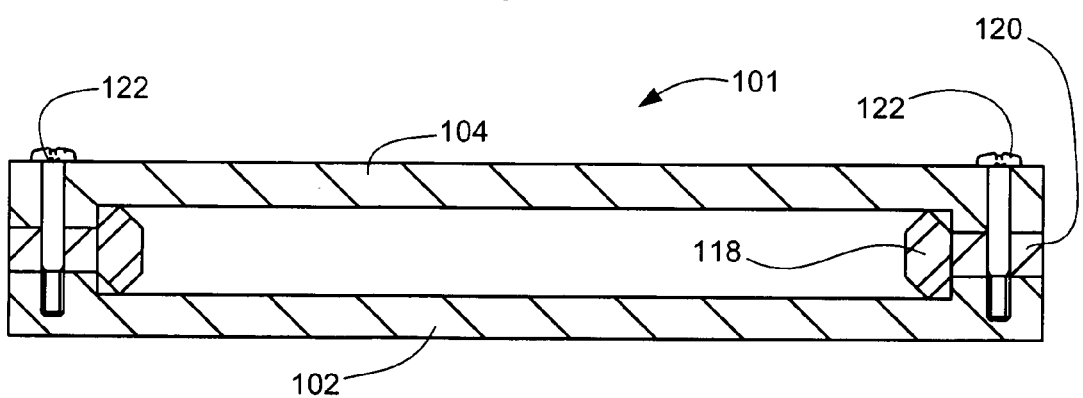
FIG. 2 provides a cross-sectional, side elevational representation of the housing of FIG. 1.

As further shown in FIG. 2, a compressive metal gasket seal 118 extends adjacent the periphery of the housing 101. An essentially non-compressive seal retention ring 120 surrounds the seal 118 and is interposed between the base deck 102 and top cover 104. A plurality of fasteners 122 are used to secure the base deck 102, top cover 104 and ring 120 together to complete the housing 101. The seal 118 preferably has a hexagonal, or "double-diamond" cross-sectional shape, although other configurations such as a c-shape could be used as desired. The ring 120 includes a number of precisely sized bosses (one denoted at 124 in FIG. 1) to limit compression of the seal 118 when the fasteners 122 are installed.

Figure 3:
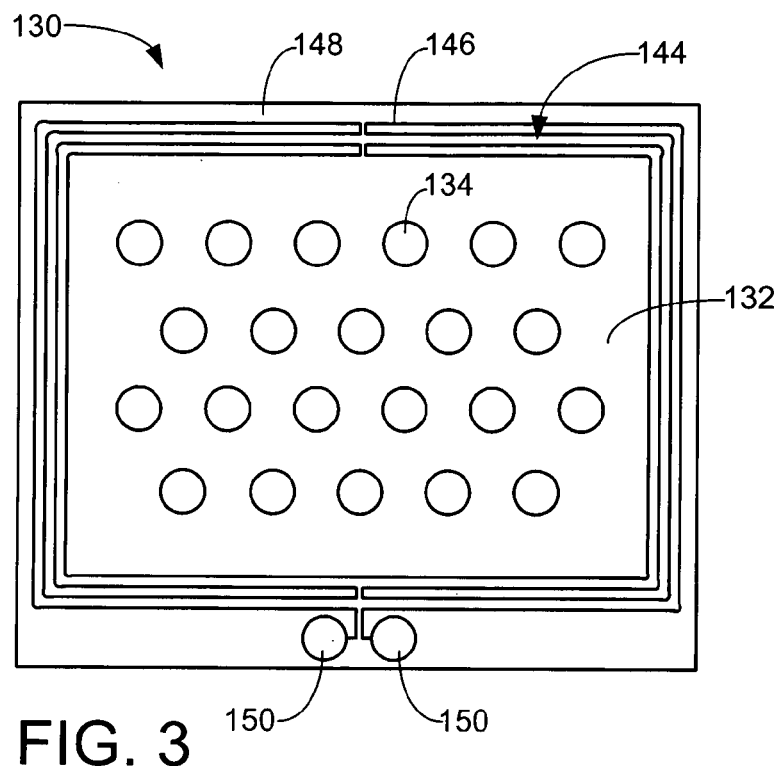
FIG. 3 provides a plan view of the electrical feedthrough assembly in accordance with a preferred embodiment.

FIG. 3 provides a plan view of a feedthrough assembly 130, constructed in accordance with preferred embodiments of the present invention. The feedthrough assembly 130 provides electrical connection paths through the housing 101 to enable communication between the interior of the housing 101 and the exterior environment.

The feedthrough assembly 130 includes a rigid, low permeability plate 132 which supports a number of solid electrical contacts (posts) 134 which extend through the thickness of the plate 132. The feedthrough assembly 130 of FIG. 3 includes a total of 22 such contacts 134 which are used for connection between the flex circuit assembly 116 and the PCB. It will be understood, however, that other arrangements can be used as required for a given application, including arrangements that connect the spindle motor 106 to the PCB. Moreover, for designs that encapsulate all of the electronics within the housing 101, the feedthrough assembly could be used to establish all the requisite communication paths with an external host device.

Figure 4:
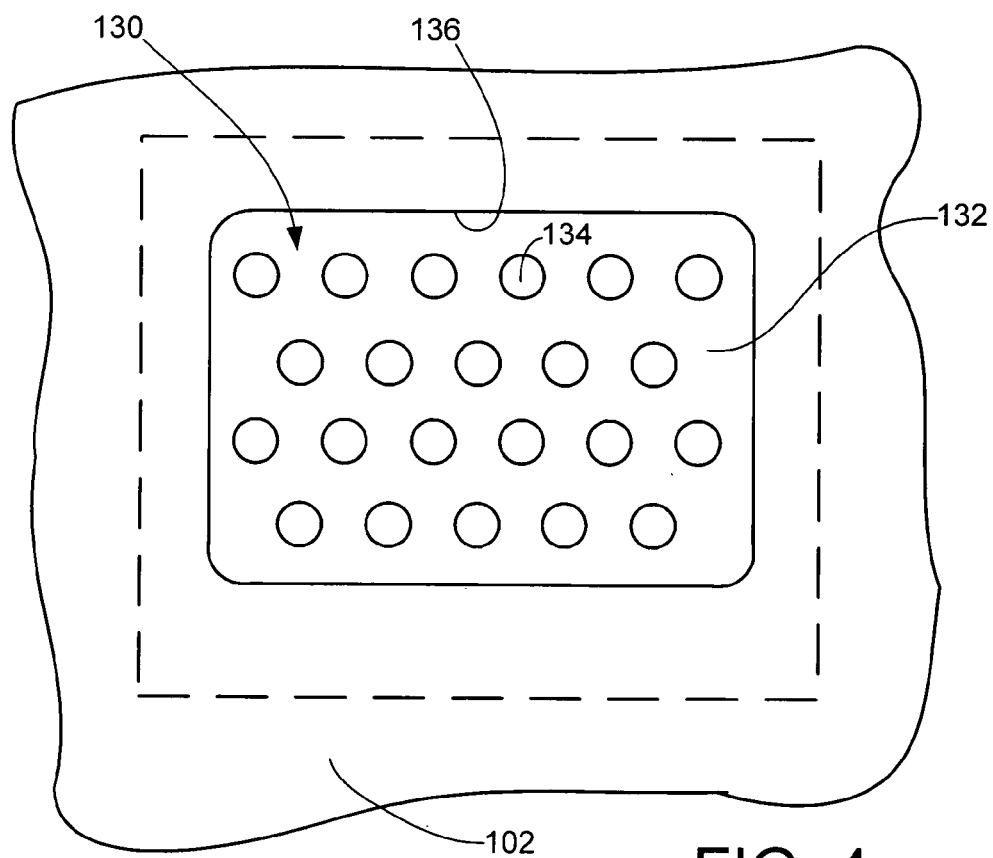
FIG. 4 illustrates the feedthrough assembly upon attachment of the assembly to a base deck of the data storage device housing, the feedthrough assembly spanning and sealing an aperture in the base deck.

FIG. 4 illustrates the feedthrough assembly 130 in conjunction with a portion of the base deck 102. The feedthrough assembly 130 spans and seals an aperture 136 formed in the base deck 102, thereby allowing access to the contacts 134 from the interior of the housing 101 to provide electrical connection paths between the interior and exterior environments.

Figure 5:
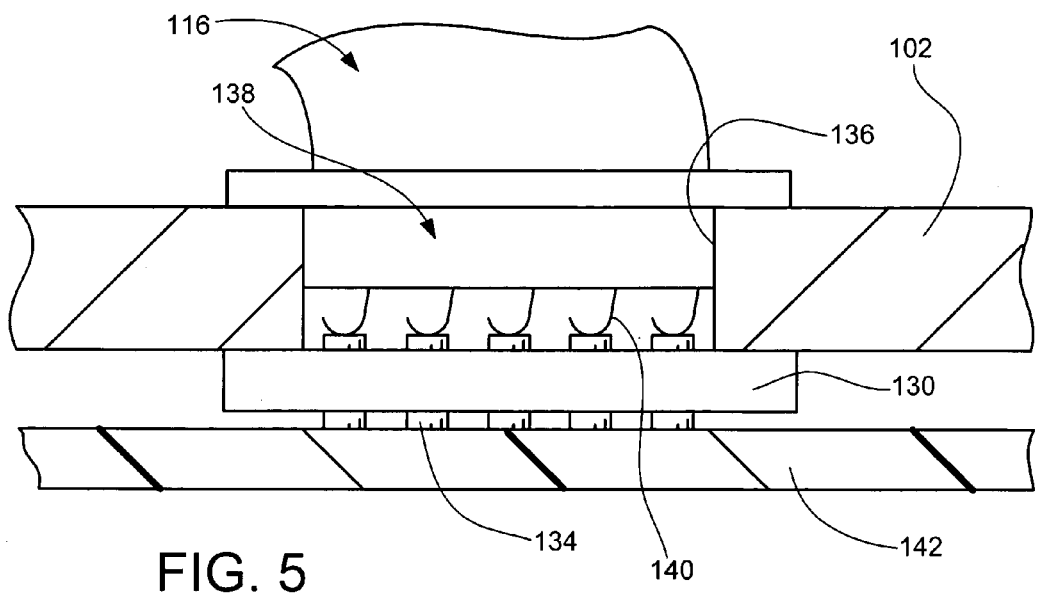
FIG. 5 is a side elevational representation (not to scale) of the feedthrough assembly and base deck of FIG. 4.

FIG. 5 provides an exemplary configuration for the device 100 in which a flex circuit connector 138 provides a number of spring contacts 140 that compressingly engage the top, or proximal ends of the contacts 134. The aforementioned PCB (denoted at 142) is also illustrated in FIG. 5 and likewise includes solder pads (not designated) that engage the bottom, or distal ends of the contacts 134. Any number of different engagement configurations can be used with the contacts 134, as desired.

Returning to FIG. 3, the feedthrough assembly 130 further preferably includes a heating member 144 comprising a circumferentially extending conductor 146 embedded in thin-film, flexible, dielectric layer 148 of the plate 132. A particularly suitable material for the dielectric layer 148 is KAPTON® polyimide film commercially available from E. I. du Pont de Nemours and Company Corporation, Circleville, Ohio, USA.

The conductor 146 preferably comprises an elongated, embedded electrical trace that makes a plurality of adjacent u-shaped turns ("double-backs") as the conductor 146 weaves around each half of the plate 132 in turn. Other circumferentially extending routings of the conductor 146 can readily be employed, including configurations in which the turns are placed at different locations around the peripheral extent of the plate.

The conductor 146 terminates on opposing ends with a pair of heating contacts 150, which preferably have substantially the same construction as the contacts 134. In this way, current can be applied to the conductor 146 from the underside of the feedthrough assembly 130 during installation onto the base deck 102. The current results in the generation of heat within the heating member 144 as a result of $I^2R$ losses due to the impedance of the conductor 146.

While the inclusion of the integrated heating member 144 is optional, the disclosed structure is suited for standard microfabrication techniques and therefore allows for easy integration of such sealing components into the fabrication process.

The feedthrough assembly 130 further preferably includes a number of closely spaced, concentrically disposed rings of sealing material that are overlaid onto the conductor 146. Alternatively, the sealing material can be initially provisioned onto the base deck, and grooves (not shown) can be used to locate and secure the sealing material prior to attachment of the feedthrough assembly 130 to the base deck.

The sealing material preferably comprises solder, but can alternatively comprise other heat activated, low permeability fusing materials such as certain types of thermoset adhesives. Four concentric rings 154 of the sealing material are represented in the simplified diagram of in FIG. 6, although other numbers of the sealing material could readily be used as desired. While a single ring of the sealing material could provide sufficient sealing, it will be noted that the use of multiple concentric rings increases the diffusion path from the interior of the housing 101 to the exterior environment, and thus enhances the ability to achieve and maintain a hermetic seal between the feedthrough assembly 130 and the base deck 102.

Figures 7, 10:
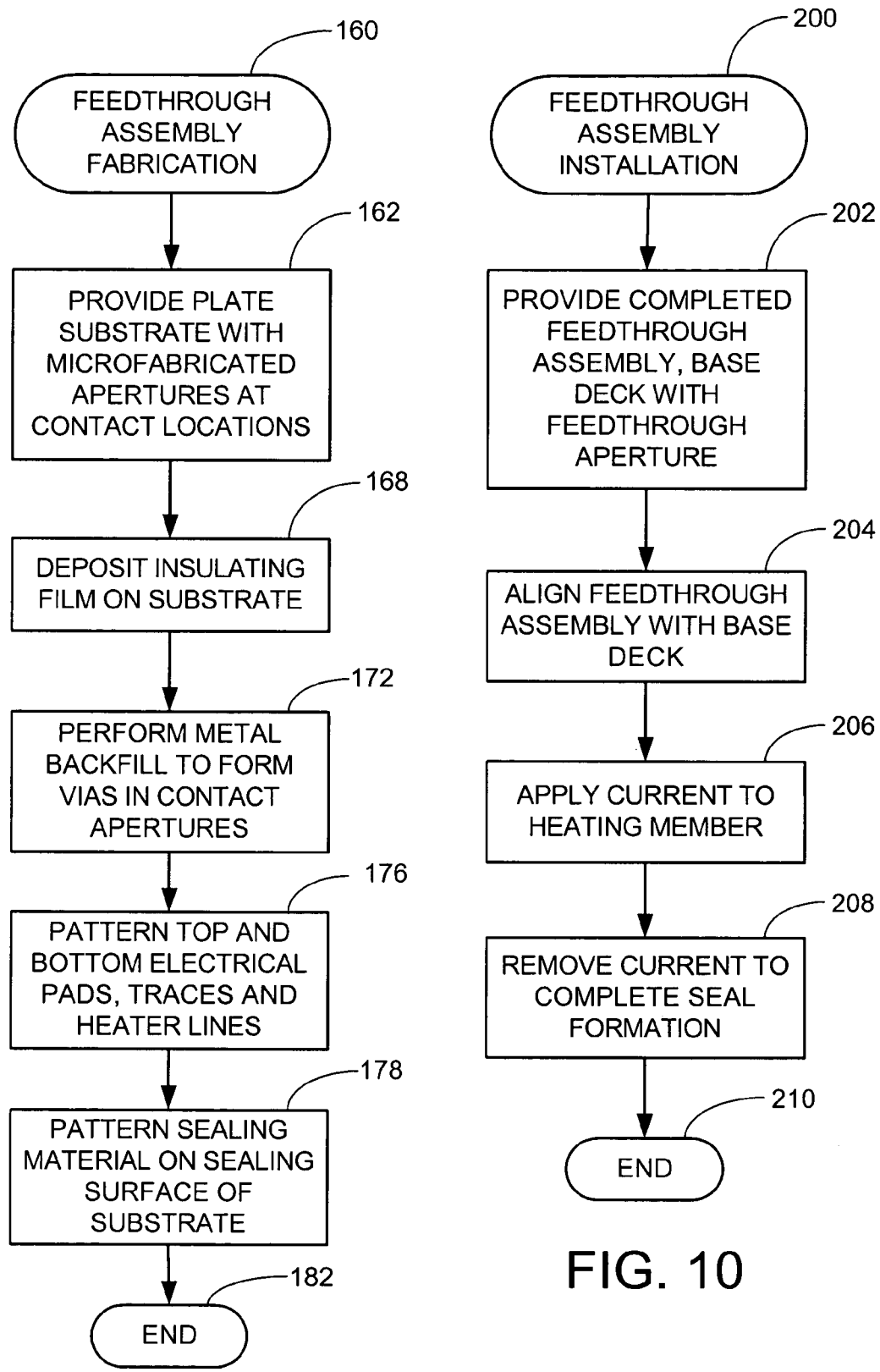
FIG. 7 is a flow chart for a FEEDTHROUGH ASSEMBLY FABRICATION routine, illustrative of steps carried out in accordance with preferred embodiments to fabricate the feedthrough assembly.
FIG. 10 is a flow chart for a FEEDTHROUGH ASSEMBLY INSTALLATION routine, illustrative of steps carried out in accordance with preferred embodiments to install the feedthrough assembly of FIGS. 7 and 8.
Figure 8:
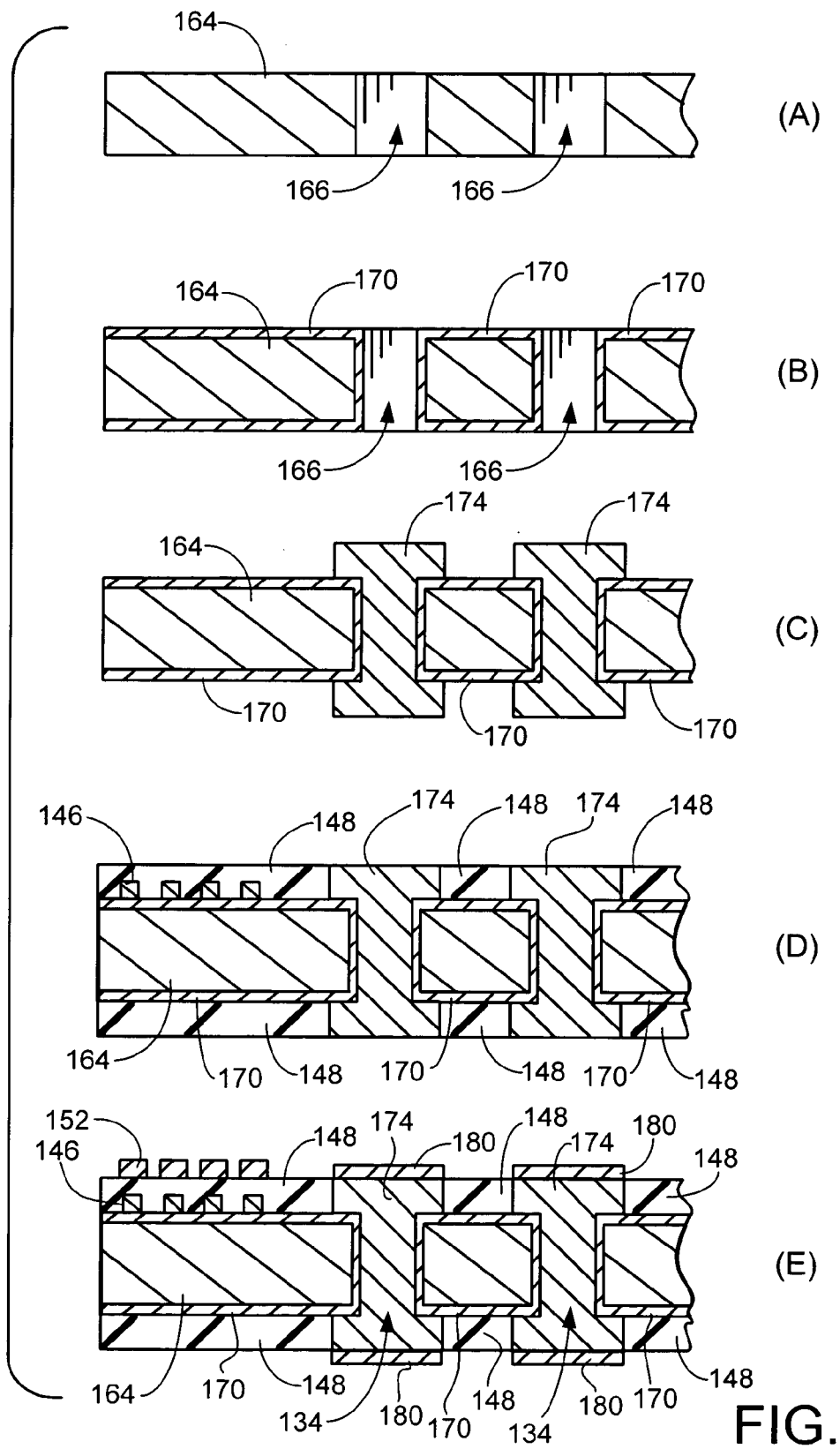
FIG. 8 provides a sequence of fabrication steps corresponding to the flow chart of FIG. 7.

FIG. 7 provides a flow chart for a FEEDTHROUGH ASSEMBLY FABRICATION routine 160, illustrative of preferred steps carried out to fabricate the feedthrough assembly 130. It will be recognized that numerous variations can be employed as desired, and so FIG. 7 is not intended to be limiting. FIG. 8 provides a fabrication sequence that generally corresponds to the flow of FIG. 7.

Preferably, FIGS. 7 and 8 are carried out using one or more microfabrication processes such as photolithography, wet and dry chemical etching, chemical vapor deposition, electroplating, sputtering, ion milling, etc. that are common in MEMS (Micro-ElectroMechancial Systems) and microelectronics fabrication.

The flow of FIG. 7 begins at step 162 with the provision of a substrate 164 with microfabricated apertures 166. This is illustrated in FIG. 8, part (A). Preferably, the substrate 164 comprises a low-permeability material such as single-crystal silicon. The apertures 166 are formed in the substrate 164 at the desired locations for the signal transfer contacts 134 and the heating contacts 150. The apertures 166 are preferably formed using photolithography combined with deep trench reactive ion etching (DRIE), or other suitable process. This allows for precise, high density and flexible designs and the use of batch fabrication to reduce manufacturing costs.

At step 168 in FIG. 7, insulating film 170 is formed on the substrate 164 and the sidewalls of the apertures 166. This is illustrated in FIG. 8, part (B). The insulating film 170 preferably comprises silicon dioxide or other conformal insulator material which is deposited (using a method such as chemical vapor deposition) or grown (such as by thermal oxidation of the silicon substrate 164). The film 170 serves to electrically insulate metal vias and traces (discussed below) from the substrate 164 and hence, from each other.

A metal backfill operation is next preferably performed at step 172 in FIG. 7 to form vias 174 in the apertures 166, as shown in FIG. 8, part (C). During this step, a suitable conductive material such as copper preferably fills the apertures 166, coats the adjoining annular areas surrounding the apertures 166 and extends upwardly and downwardly beyond the insulative film 170 a selected distance, as shown.

At step 176 in FIG. 7, deposited metal is patterned to form the desired conductor 146 and other elements of the heating member 144, preferably using one or more microfabrication processes including photolithography, wet and dry chemical etching, chemical vapor deposition, electroplating, sputtering and ion milling. See FIG. 8, part (D). The aforementioned dielectric layer 148 is preferably applied at this time to encapsulate these features, as shown in FIG. 8.

Finally, the sealing material 154 is applied at step 178 in FIG. 7 (see FIG. 8, part (E)). A second metal deposition operation can also be performed on the opposing ends of the vias 174 to provide thin layers of conductive material 180, such as gold, to complete the contacts 132. The process then ends at 182.

Figure 9:
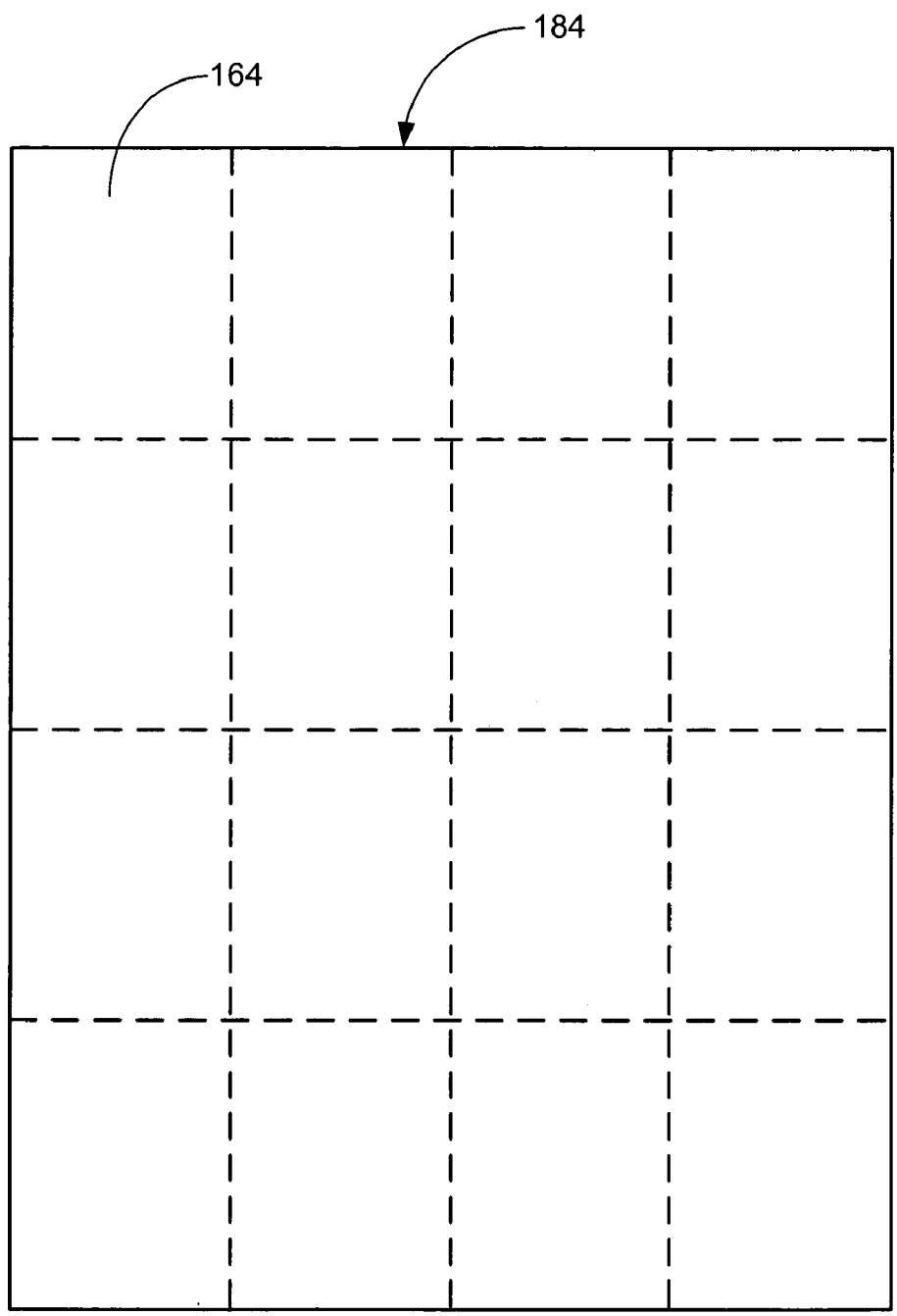
FIG. 9 is a schematic depiction of a panel of substrates from which a plurality of the feedthrough assemblies are preferably formed during a batch fabrication process utilized during the routine of FIG. 7.

An advantage of the routine of FIG. 7 is that a batch fabrication process can be employed in which multiple substrates 164 are initially joined together in a larger panel 184, as depicted in FIG. 9. This facilitates the concurrent manufacture of a population of the feedthrough assemblies 130 in accordance with the flow of FIG. 7, and then the separation of the feedthrough assemblies 130 for individual use. Such a batch fabrication method combines the precision and control of microfabrication with a lower-cost manufacturing method compared with conventional machining.

FIG. 10 provides a flow chart for a FEEDTHROUGH ASSEMBLY INSTALLATION routine 200 to summarize preferred steps used to install the completed feedthrough assembly 130 onto the base deck 102.

At step 202, the feedthrough assembly 130 and base deck 102 are initially provided, the base deck 102 having the aforementioned feedthrough aperture 136 sized appropriately for the dimensions of the feedthrough assembly. At step 204, the feedthrough assembly 130 is brought into alignment with the base deck 102 so as to span and surround the aperture 136. Appropriate fixturing (not shown) is preferably used to temporarily secure these respective members together.

Figure 6:
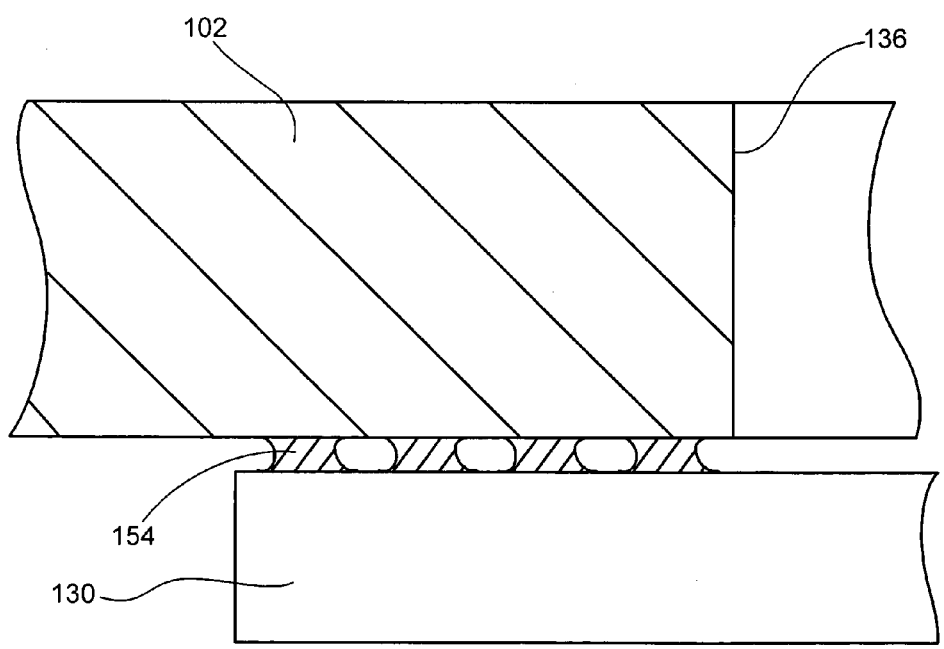
FIG. 6 shows a portion of the feedthrough and base deck of FIG. 4 in greater detail to illustrate a preferred attachment methodology.

Current is next applied to the heating member 144 at step 206. Terminals from a power source (not shown) are brought into alignment with the heating contacts 150 so that current flows along the conductor 146, thereby heating and flowing the rings 154 of sealing material. The magnitude and duration of the current will depend upon a number of factors and can be readily ascertained empirically. The current is thereafter removed at step 208, enabling the sealing material to harden in the final sealed configuration (as shown in FIG. 6), and the process ends at step 210.

It will now be recognized that the present invention, as embodied herein and as claimed below, is generally directed to an electrical feedthrough assembly for establishing an electrical connection path through an aperture in a side wall of a housing, a housing incorporating such, and a method of fabrication thereof.

In accordance with preferred embodiments, the feedthrough assembly comprises a plate (such as 132) having opposing sides and a thickness therebetween, at least one electrical contact (such as 134) which extends through the thickness of the plate to establish said electrical connection path, and a heating member (such as 144) which extends along a circumference of the plate. The plate is sized to span and surround the aperture (such as 136) so that, upon generation of heat by the heating member, at least one ring (such as 154) of sealing material adjacent the heating member flows to establish a seal between the plate and the housing wall surrounding the aperture.

The sealing material preferably comprises one or more rings of solder or thermoset adhesive. Preferably, the sealing material comprises a plurality of adjacent, closed concentric rings which establish a substantially hermetic seal.

The heating member preferably comprises an embedded electrical conductor (such as 146) which circumferentially extends adjacent a peripheral edge of the plate. The heating member generates the aforementioned heat by application of current to the conductor.

In accordance with further preferred embodiments, the feedthrough assembly is preferably fabricated using a method (such as 160) comprising steps of providing a planar substrate (such as 164) and forming the at least one electrical contact through a thickness of the substrate using a microfabrication process.

Preferably, the substrate comprises silicon, and the at least one contact extends through a microfabricated aperture formed by deep reactive ion etching.

Moreover, the providing and performing steps are preferably carried out using a batch fabrication operation so that a population of the substrates are affixed together in a panel, and wherein the method further comprises subsequently separating the substrates from said panel.

In further preferred embodiments, a sealed housing (such as 101) is provided comprising a planar housing member (such as 102) having an aperture (such as 136) and first means for spanning and sealing the aperture to provide an electrical connection path between an interior of the housing and an exterior environment. Consistent with the foregoing discussion, the first means will be understood to correspond to the aforementioned feedthrough assembly 130.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application of the housing without departing from the spirit and scope of the present invention.

In addition, although the embodiments described herein are directed to the hermetic sealing of a data storage device housing, it will be appreciated by those skilled in the art that the housing can be used for various other types of sealed enclosures without departing from the spirit and scope of the claimed invention.

What is claimed is:

1. A feedthrough assembly for establishing an electrical connection path through an aperture in a housing wall, the feedthrough assembly comprising:
   a plate having opposing sides and a thickness therebetween;
   at least one electrical contact which extends through the thickness of the plate to establish said electrical connection path; and
   a heating member which extends along a circumference of the plate, wherein the plate is sized to span and surround the aperture so that, upon generation of heat by the heating member, at least one ring of sealing material adjacent the heating member flows to establish a seal between the plate and the housing wall surrounding the aperture.

2. The electrical feedthrough assembly of claim 1, wherein the at least one ring of sealing material comprises a ring of solder.

3. The electrical feedthrough assembly of claim 1, wherein the at least one ring of sealing material comprises a ring of thermoset adhesive.

4. The electrical feedthrough assembly of claim 1, wherein the at least one ring of sealing material comprises a plurality of adjacent, closed concentric rings of the sealing material.

5. The electrical feedthrough assembly of claim 1, wherein the heating member comprises an embedded electrical conductor which circumferentially extends adjacent a peripheral edge of the plate.

6. The electrical feedthrough assembly of claim 5, wherein the heating member generates said heat by application of current to the conductor.

7. The electrical feedthrough assembly of claim 1, wherein the sealing material establishes a substantially hermetic seal.

8. The electrical feedthrough assembly of claim 1, in combination with said housing.

9. The combination of claim 8, wherein the housing comprises a housing of a data storage device which encloses a data recording medium.

10. The electrical feedthrough assembly of claim 1, fabricated by steps comprising providing a planar substrate and forming the at least one electrical contact through a thickness of the substrate using a microfabrication process.

11. The electrical feedthrough assembly of claim 10, wherein the substrate comprises silicon.

12. The electrical feedthrough assembly of claim 10, wherein the at least one contact extends through a microfabricated aperture formed by deep reactive ion etching.

13. The electrical feedthrough assembly of claim 10, wherein the providing and forming steps are carried out using a batch fabrication operation so that a population of the substrates are affixed together in a panel, and wherein the method further comprises subsequently separating the substrates from said panel.

14. A sealed housing, comprising:
    a planar housing member having an aperture; and
    first means for spanning and sealing the aperture to provide an electrical connection path between an interior of the housing and an exterior environment, said first means comprising second means for generating heat to seal said aperture.

15. The sealed housing of claim 14, wherein the first means comprises a feedthrough assembly including a plate having opposing sides and a thickness therebetween, at least one electrical contact which extends through the thickness of the plate to establish said electrical connection path, and a heating member which extends along a circumference of the plate, wherein the plate is sized to span and surround the aperture so that, upon generation of heat by the heating member, at least one ring of sealing material adjacent the heating member flows to establish a seal between the plate and the housing wall surrounding the aperture.

16. The sealed housing of claim 15, wherein the at least one ring of sealing material comprises a ring of solder.

17. The sealed housing of claim 15, wherein the heating member comprises an embedded electrical conductor which circumferentially extends adjacent a peripheral edge of the plate, and wherein the heating member generates said heat by application of current to the conductor.

18. The sealed housing of claim 15, wherein the sealing material establishes a substantially hermetic seal.

19. The sealed housing of claim 14, wherein the housing comprises a housing of a data storage device which encloses a data recording medium.

20. An apparatus comprising a housing wall through which an aperture extends, a feedthrough plate adjacent the aperture, a ring of sealing material adjacent the plate, and a heating member adjacent said sealing material which generates heat to cause said sealing material to flow and thereby establish a seal between the plate and the housing wall.

21. The apparatus of claim 20, wherein the ring of sealing material comprises a ring of solder.

22. The apparatus of claim 20, wherein the ring of sealing material comprises a ring of thermoset adhesive.

23. The apparatus of claim 20, wherein the ring of sealing material is characterized as a first ring, and wherein the apparatus comprises a second ring of sealing material adjacent the first ring.

24. The apparatus of claim 20, wherein the heating member comprises an embedded electrical conductor which circumferentially extends adjacent a peripheral edge of the plate.

25. The apparatus of claim 24, wherein the heating member generates said heat by application of current to the conductor.

26. The apparatus of claim 20, wherein the sealing material establishes a substantially hermetic seal.

27. The apparatus of claim 20, wherein the plate is fabricated by steps comprising providing a planar substrate and forming at least one electrical contact through a thickness of the substrate using a microfabrication process.

* * * * *